United States Patent [19]

Ward, Jr. et al.

[11] 4,403,029
[45] Sep. 6, 1983

[54] STRIPPING COMPOSITIONS AND METHODS OF STRIPPING RESISTS

[75] Inventors: Irl E. Ward, Jr.; Lisa G. Hallquist; Thomas J. Hurley, all of Easton, Pa.

[73] Assignee: J. T. Baker Chemical Company, Phillipsburg, N.J.

[21] Appl. No.: 413,995

[22] Filed: Sep. 2, 1982

[51] Int. Cl.³ .......................... G03C 5/30; B08B 7/00; C11D 1/18; B01F 1/00
[52] U.S. Cl. ...................... 430/258; 134/38; 252/153; 252/171; 252/542; 252/544; 252/549; 252/364; 252/DIG. 4; 430/260; 430/309; 430/329; 430/331
[58] Field of Search .............. 252/171, 542, 153, 549, 252/544, DIG. 4, 364; 134/38; 430/329, 331, 258, 260, 309

[56] References Cited

U.S. PATENT DOCUMENTS 2,891,849  6/1959  Whitbourne .................. 430/331
4,304,681  12/1981  Martin et al. ................... 252/171

Primary Examiner—Mary F. Downey
Attorney, Agent, or Firm—George W. Rauchfuss, Jr.

[57] ABSTRACT

Stripping compositions for removing resist materials from substrates comprise compositions of dimethylacetamide or dimethylformamide or a mixture thereof and a tetrahydrothiophene 1,1-dioxide compound. Either or both of polyethylene glycol and a diethylene glycol monoalkyl ether may be added to provide even more effective stripping compositions

28 Claims, No Drawings

STRIPPING COMPOSITIONS AND METHODS OF STRIPPING RESISTS

FIELD OF THE INVENTION

This invention relates to novel resist stripping compositions and to methods of stripping resists employing said stripping compositions. More particularly, this invention relates to a novel resist stripping composition comprising dimethylacetamide or dimethylformamide or a mixture thereof in combination with a tetrahydrothiophene 1,1-dioxide compound which can also include polyethylene glycol and/or a diethylene glycol monoalkyl ether and to stripping resists with said stripping compositions.

BACKGROUND OF THE INVENTION

Modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary to such a photolithographic process that the photoresist material, following pattern delineation, be evenly and completely removed from all unexposed areas so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

Heretofore the resist materials have been removed by stripping agents containing one or more of the following: halogenated hydrocarbons, for example, methylene chloride or tetrachloroethylene; amines and their derivatives such as dimethylformamide, N-methyl-2-pyrrolidone, diethanolamine and triethanolamine; glycol ethers such as ethylene glycol monoethyl ether, 2-butoxyethanol, 2-(2-butoxyethoxy)ethanol, and the acetates thereof; ketones such as methyl ethyl ketone, acetone, methyl isobutyl ketone and cyclohexanone, as well as such materials as dioxane, sodium phenolate, isopropyl alcohol, sulfuric acid/nitric acid mixtures, persulfuric acid mixtures such as Caro's acid and sulfuric acid/ammonium persulfate, and mixtures of caustic and phenol derivatives as well as various other materials.

However, there are various and numerous drawbacks and disadvantages with these various materials. Among the one or more drawbacks and disadvantages found in the use of each such stripping agents there may be mentioned the following: undesirable flammability, volatility, odor and toxicity; incomplete removal of all resist film; effectiveness only on certain resist films; attack of components other than the resist material, such as attack of metal substrates by the stripping agent; safely in handling and disposal of the stripper; and the undesired necessity for use at specified elevated temperatures when selected resists are being stripped. Furthermore, the limited stripping capabilities of the stripping agents is a very decided drawback. Additionally, many such strippers are not sufficiently effective against resist materials that are subject to a severe post-baking operation thereby limiting their usefulness. In some of the strippers the presence of water is extremely detrimental. Additionally, for those stripping applications requiring inertness of the agent to metal substrates, toxicity during handling and difficulty of disposal are primary drawbacks.

SUMMARY OF THE INVENTION

It has now been found that a suitable photoresist stripping composition in which the hereinbefore mentioned disadvantages and drawbacks are eliminated or substantially reduced and in which the range of usefulness of the stripping composition is greatly extended can be obtained in accordance with the teachings of the present invention. The novel stripping compositions also exhibit a synergistically enhanced stripping action and provide resist stripping capabilities not possible from the use of the individual components used alone as photoresist strippers. The novel stripping compositions of this invention comprise a mixture of from about 30 to about 90 percent by weight of a dimethylacetamide or dimethylformamide or a mixture thereof and from about 10 to about 70 percent by weight of a tetrahydrothiophene-1,1-dioxide compound.

Even more effective stripping compositions are provided if there is added to the basic mixture either or both of the following materials; from about 3 to about 20 percent by weight of polyethylene glycol and/or from about 10 to about 30 percent by weight of a diethylene glycol monoalkyl ether. The presence of water in the stripping compositions of this invention is not detrimental and can be present in an amount from about 0 to about 10 percent by weight without undue adverse effects resulting.

The invention also relates to the use of such stripping compositions for removing photoresist material from a substrate surface.

DETAILED DESCRIPTION OF THE INVENTION

The stripping compositions of this invention comprise stripping compositions containing from about 30 to about 90 weight percent, preferably from about 45 to about 90 weight percent, more preferably from about 60 to about 70 weight percent, and most preferably about 70 weight percent of a dimethylacetamide, dimethylformamide or a mixture thereof, and from about 10 to about 70 weight percent, preferably from about 10 to about 55 weight percent, more preferably about 30 to about 40 weight percent, and most preferably about 30 weight percent of a tetrahydrothiophene-1,1-dioxide compound of the general formula

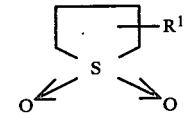

wherein R¹ is hydrogen, methyl or ethyl.

As examples of tetrahydrothiophene-1,1-dioxide compounds of the hereinbefore set forth formula suitable for use in the compositions of this invention there may be mentioned for examples tetrahydrothiophene-1,1-dioxide, methyl tetrahydrothiophene-1,1-dioxide and ethyl tetrahydrothiophene-1,1-dioxide. Especially preferred is tetrahydrothiophene-1,1-dioxide.

An even more effective and desirable stripping composition is provided when from about 3 to about 20 weight percent, preferably about 5 to about 15 weight percent, and most preferably about 6 weight percent polyethylene glycol is added to the aforementioned stripping mixture. Another effective and desirable stripping composition is provided when from about 10 to about 30 weight percent, preferably from about 15 to about 20 weight percent and most preferably about 17 weight percent of a diethylene glycol monoalkyl either, preferably 2-(2-ethoxyethoxy)ethanol, is added to the mixture of a dimethylacetamide, or dimethylformamide and a tetrahydrothiophene-1,1-dioxide compound. The diethylene glycol monoalkyl ethers that may be employed in the compositions of this invention are those of the formula $HOCH_2CH_2-O-CH_2CH_2-O-R^2$ wherein $R^2$ is alkyl of 1 to 4 carbon atoms. Examples of such compounds for use in the compositions of this invention are for example, the monomethyl-, monoethyl- and monobutyl- ethers of diethylene glycol. Expecially preferred is 2-(2-ethoxyethoxy)ethanol.

A still more preferred stripping composition of this invention comprises a stripping composition wherein all four of the hereinbefore mentioned materials are present in the composition in the weight percents previously stated.

A most preferred stripping composition of this invention comprises a mixture of from about 51% dimethylacetamide of dimethylformamide, about 26% tetrahydrothiophene-1,1-dioxide, about 17% 2-(2-ethoxyethoxy)ethanol and about 6% polyethylene glycol.

While the compositions of this invention can be free of water this is not essential and water can be present in an amount of up to about 10 percent by weight.

As exemplary stripping compositions of this invention there can be mentioned the following compositions of Table I.

TABLE I

| Component | Percent by Weight Composition | | | | | | | |
|---|---|---|---|---|---|---|---|---|
| | A | B | C | D | E | F | G | H |
| Dimethylacetamide | 70 | — | 70 | — | 51 | — | 60 | — |
| Dimethylformamide | — | 70 | — | 70 | — | 51 | — | 62 |
| Tetrahydrothiophene-1,1-dioxide | 30 | 30 | — | — | 26 | 26 | 25 | 32 |
| 3-methyl tetrahydrothiophene-1,1-dioxide | — | — | 30 | 30 | — | — | — | — |
| 2-(2-ethoxyethoxy) ethanol | — | — | — | — | 17 | 17 | 15 | — |
| Polyethylene glycol | — | — | — | — | 6 | 6 | — | 6 |

In the compositions of this invention any suitable polyethylene glycol may be employed although polyethylene glycol of a molecular weight of about 200 is preferred.

The stripping compositions of this invention are effective in stripping a wide and varied range of positive photoresists. Most positive photoresists consist of an ortho napthoquinone diazide sulfonic acid ester or amide sensitizer or photoactive component, with novolak, resole, polyacrylamide or acrylic copolymer type binders or resins. Such positive photoresists are well known in the art. Such resists and sensitizers are described, for example, in U.S. Pat. Nos. 3,046,118; 3,046,121; 3,106,465; 3,201,239; 3,538,137; 3,666,473; 3,934,957; 3,984,582 and 4,007,047. As examples of such positive photoresist compositions for which the stripping composition of this invention may be used there may be mentioned Eastman Kodak Company photoresist Kodak 809; J. T. Baker Chemical Company photoresist PR-20; Philip A. Hunt Chemical Corp. Waycoat HPR 104, HPR 106, HPR 204 and HPR 206 photoresists; Shipley Company Inc. photoresist AZ-1350, AZ-1350B, AZ-1350H, AZ-1350J, AZ-1370, AZ-1450B, AZ-1450J, AZ-1470, AZ-2400 and AZ-111; Polychrome Corporation photoresists PC-129, PC-129SF and PC-138; FuJu Chemicals Industrial Co. photoresist FPR-200; and Tokyo Ohka Kogyo Co. Ltd. photoresist OFPR-800.

The stripping compositions of this invention are effective in completely removing photoresist materials from substrates even when they have been subjected to a post-bake treatment of about 150° C. for a period of about one hour.

The stripping compositions of this invention are especially advantageous for numerous reasons among which may be mentioned the following. The stripping compositions remove positive photoresist materials from metal and other substrates without attacking the substrate. The compositions are essentially non-toxic and are water miscible. The presence of water during the stripping operation is not deleterious to the operation of the stripping composition. Unlike phenolic based strippers the compositions of this invention require no special handling and are easily disposed of in normal sewage treatment facilities. Moreover the bath life and stripping effectiveness of the compositions are for the most part independent of temperature. Use of the stripping compositions of this invention requires only a subsequent rinse with deionized water whereas many prior strippers require the use of additional organic solvents. The stripping compositions of this invention completely remove difficult-to-remove positive photoresists at about 75° C. or less whereas some prior art strippers require bath temperatures of about 95° to 100° C. Also, most positive photoresists are completely stripped in about one minute or less while stripping times of 5 to 20 minutes are recommended for many commercial stripping compositions.

It has been unexpectedly found that the stripping compositions of this invention effectively and completely remove positive photoresist material from substrates which photoresist materials are not effectively and completely removed by the individual components of the compositions of this invention.

The effectiveness and unexpected nature of the stripping action of stripping composition of the invention is illustrated by the data presented in the following Table II.

Wafer substrates were coated with positive photoresist materials according to art recognized procedures and post-baked at about 150° C. for a period of about 45 minutes to one hour. Stripping baths were maintained at constant temperature with water baths and the post-baked coated wafers were immersed into 600 ml beakers containing the constant temperature stripping compositions with intermittent agitation for the specified times after which the wafer is removed, rinsed in running deionized water and spin dried at 3000 rpm. Strippability was judged by inspection of the wafers to ascertain if any residue was present.

Compositions of this invention, denoted as compositions A through C, which correspond in composition to those so designated in Table I, are compared to results obtained for the individual components alone for three generally difficult to remove photoresists, namely Shipley's AZ-1350J photoresist, Tokyo Ohka Kogyo Co. Ltd.'s OFPR-800 photoresist and Philip A. Hunt Chemical-Corp. HPR 204 photoresist.

TABLE II

| Stripping Composition | Temperature °C., Time and % Removal | | |
|---|---|---|---|
| | HPR-204 Photoresist | AZ-1350J Photoresist | OFPR-800 Photoresist |
| dimethyl-acetamide | 25°, 5¼ min., 100% | 75°, 2 min., 100% | 75°, 4 min., 100% |
| dimethyl-formamide | | 75°, 4½–5 min., 100% | 75°, 13 min., 100% |
| tetrahydrothio-phene-1,1-dioxide | 25°, 7 min., <50% | 75°, 8 min., <50% | 75°, 6 min., <20% |
| 3-methyl tetra-hydrothiophene 1,1-dioxide | 25°, 8 min., 75% | — | 75°, 8 min., <50% |
| A | 25°, 90 sec., 100% | — | — |
| B | — | 75°, ~30° sec., 100% | 75°, ~1 min., 100% |
| C | 25%, 1 min., 100% | 75%, 1½ min., 100% | 75%, 2½ min., 100% |

The above examples are given merely by way of illustration and are not to be considered to limit the invention.

It is anticipated that the stripping compositions of this invention can be used as stripping agents for positive photoresists by contacting the unexposed photoresist on a substrate with the stripping composition in a variety of means, such as by immersion in a stripping bath or by spraying the stripping composition over the surface of the unexposed photoresist.

While the use of the above compositions for stripping photoresist materials from substrates has alone been illustrated it will be appreciated that the stripping compositions of the invention are suitable for other uses which will be apparent to those skilled in the art, such as, for example, in the stripping of polymer residues from reaction or curing vessels and the like, or for stripping coatings, such as for example, paints and varnishes and the like, from surfaces.

We claim:

1. A stripping composition comprising from about 30 to about 90 weight percent of a compound selected from the group consisting of dimethylacetamide, dimethylformamide and mixtures thereof, and from about 10 to about 70 weight percent of a tetrahydrothiophene-1,1-dioxide compound of the formula

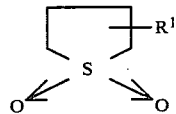

wherein $R^1$ is selected from the group consisting of hydrogen, methyl or ethyl.

2. A composition of claim 1 comprising from about 45 to about 90 weight percent of a compound selected from the group consisting of dimethylacetamide, dimethylformamide, and mixtures thereof and from about 10 to about 55 weight percent tetrahydrothiophene-1,1-dioxide.

3. A composition of claim 2 comprising about 70% dimethylacetamide and 30% tetrahydrothiophene-1,1-dioxide.

4. A composition of claim 2 comprising about 70% dimethylformamide and 30% tetrahydrothiophene-1,1-dioxide.

5. A composition of claim 1 having from about 10 to about 30 weight percent of a diethylene glycol monoalkyl ether of the formula $$HOCH_2CH_2-O-CH_2CH_2-O-R^2$$

wherein $R^2$ is alkyl of 1 to 4 carbon atoms.

6. A composition of claim 5 having from about 2 to about 30 weight percent 2-(2-ethoxyethoxy) ethanol also present in the composition.

7. A composition of claim 1 having from about 3 to about 20 weight percent polyethylene glycol also present in the composition.

8. A composition of claim 6 having from about 3 to about 20 weight percent polyethylene glycol also present in the composition.

9. A composition of claim 8 comprising about 51% dimethylacetamide, about 26% tetrahydrothiophene-1,1-dioxide, about 17% 2-(2-ethoxyethoxy) ethanol, and about 6% polyethylene glycol.

10. A composition of claim 8 comprising about 50% dimethylformamide, about 26% tetrahydrothiophene-1,1-dioxide, about 17% 2-(2-ethoxyethoxy) ethanol and about 6% polyethylene glycol.

11. The composition of claim 7 wherein the polyethylene glycol is polyethylene glycol of molecular weight of about 200.

12. The composition of claim 9 wherein the polyethylene glycol is polyethylene glycol of molecular weight of about 200.

13. The composition of claim 10 wherein the polyethylene glycol is polyethylene glycol of molecular weight of about 200.

14. The composition of claim 11 wherein the polyethylene glycol is polyethylene glycol of molecular weight of about 200.

15. A method wherein unexposed photoresist is stripped from a substrate by contacting the unexposed photoresist with a stripping composition, the improvement comprising utilizing as the stripping composition the composition of claim 1.

16. A method wherein unexposed photoresist is stripped from a substrate by contacting the unexposed photoresist with a stripping composition, the improvement comprising utilizing as the stripping composition the composition of claim 2.

17. A method wherein unexposed photoresist is stripped from a substrate by contacting the unexposed photoresist with a stripping composition, the improvement comprising utilizing as the stripping composition the composition of claim 3.

18. A method wherein unexposed photoresist is stripped from a substrate by contacting the unexposed photoresist with a stripping composition, the improvement comprising utilizing as the stripping composition the composition of claim 4.

19. A method wherein unexposed photoresist is stripped from a substrate by contacting the unexposed photoresist with a stripping composition, the improvement comprising utilizing as the stripping composition the composition of claim 5.

20. A method wherein unexposed photoresist is stripped from a substrate by contacting the unexposed photoresist with a stripping composition, the improvement comprising utilizing as the stripping composition the composition of claim 6.

21. A method wherein unexposed photoresist is stripped from a substrate by contacting the unexposed photoresist with a stripping composition, the improvement comprising utilizing as the stripping composition the commposition of claim 7.

22. A method wherein unexposed photoresist is stripped from a substrate by contacting the unexposed photoresist with a stripping composition, the improvement comprising utilizing as the stripping composition the composition of claim 8.

23. A method wherein unexposed photoresist is stripped from a substrate by contacting the unexposed photoresist with a stripping composition, the improvement comprising utilizing as the stripping composition the composition of claim 9.

24. A method wherein unexposed photoresist is stripped from a substrate by contacting the unexposed photoresist with a stripping composition, the improvement comprising utilizing as the stripping composition the composition of claim 10.

25. A method wherein unexposed photoresist is stripped from a substrate by contacting the unexposed photoresist with a stripping composition, the improvement comprising utilizing as the stripping composition the composition of claim 11.

26. A method wherein unexposed photoresist is stripped from a substrate by contacting the unexposed photoresist with a stripping composition, the improvement comprising utilizing as the stripping composition the composition of claim 12.

27. A method wherein unexposed photoresist is stripped from a substrate by contacting the unexposed photoresist with a stripping composition, the improvement comprising utilizing as the stripping composition the composition of claim 13.

28. A method wherein unexposed photoresist is stripped from a substrate by contacting the unexposed photoresist with a stripping composition, the improvement comprising utilizing as the stripping composition the composition of claim 14.

\* \* \* \* \*